United States Patent [19]

Kamehara et al.

[11] Patent Number: 4,504,339

[45] Date of Patent: Mar. 12, 1985

[54] METHOD FOR PRODUCING MULTILAYERED GLASS-CERAMIC STRUCTURE WITH COPPER-BASED CONDUCTORS THEREIN

[75] Inventors: Nobuo Kamehara, Isehara; Kazuaki Kurihara, Kawasaki; Koichi Niwa, Tama, all of Japan

[73] Assignee: Fujitsu Limited, Kawasaki, Japan

[21] Appl. No.: 502,598

[22] Filed: Jun. 9, 1983

[30] Foreign Application Priority Data

Jun. 16, 1982 [JP] Japan .............................. 57-101990

[51] Int. Cl.$^3$ ..................... C03B 29/00; C04B 33/34; C04B 37/00
[52] U.S. Cl. ........................................ 156/89; 264/58; 264/61; 264/62; 264/65; 264/66; 427/96
[58] Field of Search ...................... 156/89; 264/58, 61, 264/62, 65, 66; 65/33; 427/96

[56] References Cited

U.S. PATENT DOCUMENTS 4,221,047  9/1980  Narken et al. ........................ 65/33
4,234,367 11/1980  Herron et al. ........................ 156/89
4,299,873 11/1981  Ogihara et al. ...................... 428/137

Primary Examiner—Jay H. Woo
Assistant Examiner—Timothy W. Heitbrink
Attorney, Agent, or Firm—Staas & Halsey

[57] ABSTRACT

A method for producing a multilayered glass-ceramic structure with copper-based conductors therein, includes firing a multilayered structure, in which copper-based patterns and glass-ceramic layers are alternately laminated, in an inert atmosphere containing water vapor, the partial pressure of which is from 0.005 to 0.3 atmosphere. The temperature multilayered structure is fired at a temperature at which a thermally depolymerizable resin binder, contained in the glass-ceramic green sheets, is depolymerized and eliminated, but its glass components and the copper exhibit substantially no change in their state. The method also includes raising, in an inert atmosphere without water vapor, the firing temperature at which particles of the glass components coalesce, but the metallic state of copper is not affected.

14 Claims, 3 Drawing Figures

METHOD FOR PRODUCING MULTILAYERED GLASS-CERAMIC STRUCTURE WITH COPPER-BASED CONDUCTORS THEREIN

BACKGROUND OF THE INVENTION (1) Field of the Invention

The present invention relates to a method for producing multilayered glass-ceramic structures with copper-based conductors therein for use as ceramic circuit substrates provided with large scale integrated circuit (LSI) devices and the like.

(2) Description of the Prior Art

Multilayered ceramic circuit substrates comprise metal layers which act as patterned electrical conductors sandwiched between ceramic layers which act as electrical insulators. They are produced by laminating ceramic thin sheets including organic binder with printed electrical conductors thereon. The laminated structure is fired so that the binder material burns out and the ceramic particles coalesce, while the metal particles become a sintered dense metallic state.

Generally, a high-melting point metal such as molybdenum and tungsten or a noble metal such as gold is used to form the conductor layers. High-melting point metals enable high melting point alumina to be used as the insulator in such multilayered structures. Alumina is excellent in electrical insulation, thermal conductivity, and mechanical strength, and maintains these characteristics over long usage. However, its relatively high dielectric constant results in delayed signal transmission and a low signal-to-noise (S/N) ratio, and its relatively higher coefficient of thermal expansion, compared with silicon, results in mechanical defects when silicon chips are soldered thereon.

Of the high-melting point metals and noble metals, the noble metals are preferable in terms of their low electrical resistance, however, their use considerably increases overall production costs.

Therefore, it is desired to use a metal having a low electrical resistance and low cost, such as copper, as a conductor material and a ceramic material having a low coalescing temperature, such as glass-ceramic. To this end, it is necessary that the binder material contained in a glass-ceramic green sheet be depolymerized and burnt-out in an atmosphere and at a temperature wherein copper is not oxidized. When commonly known binder resins, such as polyvinyl butyral and polyvinyl acetate, are used in a glass-ceramic green sheet and are fired in a nitrogen atmosphere at a temperature up to 1150° C., these resins are neither satisfactorily depolymerized nor thoroughly oxidized. Consequently, the fired multilayered structure becomes porous and has carbonous residue therein, thereby deteriorating the mechanical strength and electrical insulation of the structure.

Lester W. Herron et al. disclose in U.S. Pat. No. 4,234,367 a method for forming sintered glass-ceramic substrates containing multilevel, interconnected thick film circuit patterns of copper-based conductors obtained by firing in a controlled ambient of hydrogen and water at temperatures below the melting point of copper. Herron et al. teach heating the green laminate in an ambient of hydrogen and water in a ratio of $H_2/H_2O$ of $10^{-4}$ to $10^{-6.5}$ to a burn-out temperature, about 700° C. to 800° C.

According to our calculation, when water vapor itself is used as such an ambient, water is thermally decomposed, so that the molar ratio of $H_2/H_2O$ under a water pressure of 1 atmosphere is equal to about $10^{-6.8}$ at 700° C. and about $10^{-6.0}$ at 800° C.

SUMMARY OF THE INVENTION

It is a primary object of the present invention to produce a multilayered glass-ceramic structure with copper layers as low electrical resistance conductors.

It is another object of the present invention to produce a multilayered glass-ceramic circuit substrate having excellent transmission performance by combining such a conductor layer and an electrical insulator of low coalescing temperature and low dielectric constant.

It is yet another object of the present invention to produce a multilayered glass-ceramic circuit substrate by firing a laminated green composite in an atmosphere with a wide range of gas ratio, in which a binder resin can be completely burnt out without any carbonous residue in the ceramic insulator and without oxidization of the copper conductor.

According to the present invention, there is provided a method for producing a multilayered glass-ceramic structure with copper-based conductors therein, comprising the steps of: (a) forming a multilayered structure in which copper-based patterns and ceramic layers are laminated alternately, at least the ceramic layers located between the copper-based patterns being glass-ceramic green sheets which contain a thermally depolymerizable resin as a binder; (b) firing the multilayered structure in an inert atmosphere containing water vapor, the partial pressure of which is from 0.005 to 0.3 atmosphere at a temperature at which the binder contained in the glass-ceramic green sheets is depolymerized and eliminated, but its glass components and copper exhibit substantially no change in their state; and (c) raising, in an inert atmosphere without water vapor, the firing temperature at which particles of the glass components coalesce, but the metallic state of copper is not affected.

DESCRIPTION OF THE PREFERRED EMBODIMENTS

Figure 1:
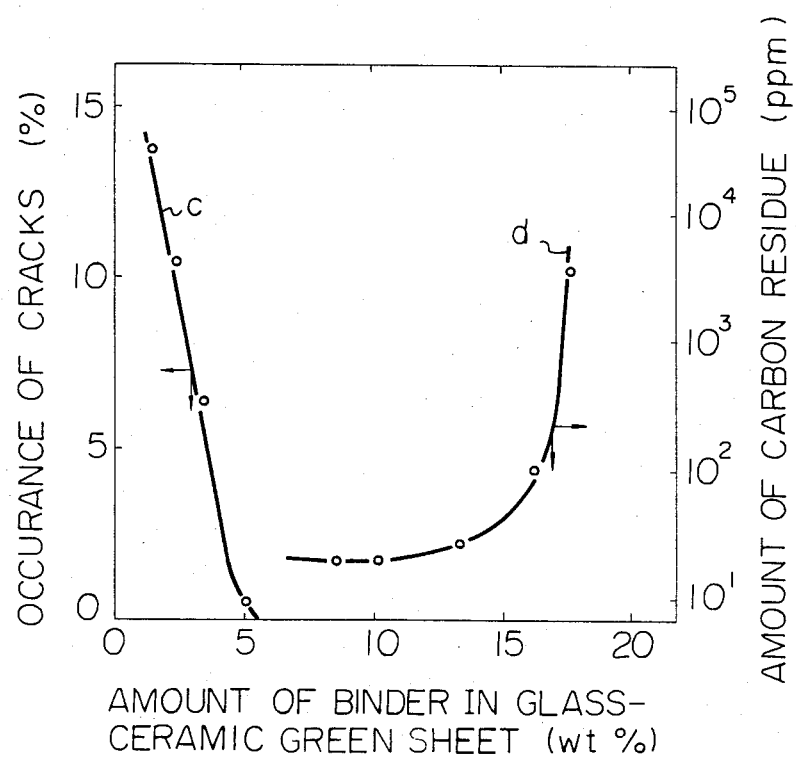
FIG. 1 is a graph of the occurrence of cracks in a green sheet and the amount of carbonous residue in a sintered sheet as a function of the amount of binder contained in a glass-ceramic green sheet.

The present invention will now be described in detail referring to the drawings.

In the method for producing a multilayered glass-ceramic structure with copper-based conductors therein according to the invention, first a multilayered structure in which patterns of copper-conductors and ceramic layers are alternately laminated, is formed. At least the ceramic layers located between the patterns of copper-conductors are of a glass-ceramic material which contains a thermally depolymerizable resin as a binder.

It is advisable that the glass-ceramic material contain from 40% to 60% by weight of alumina based on the weight of the glass-ceramic material, most advisably about 50% by weight. If it contains more than 60% by weight, the dielectric constant of the later sintered multilayered structure becomes higher. If it contains less than 40% by weight, the mechanical strength becomes deteriorated.

It is preferable that the thermally depolymerizable resin be selected from polymethyl methacrylate, polytetrafluoroethylene, poly-α-methylstyrene, and mixtures thereof.

It is feasible that the multilayered structure be formed such that the patterns of copper-based conductors and the glass-ceramic paste are alternately printed on a sintered ceramic substrate, the glass-ceramic paste layers having openings to form through-holes therethrough.

It is advantageous that the multilayered structure be formed such that a plurality of composite layers is laminated, each layer being produced by printing patterns of copper-based conductors on a glass-ceramic green sheet, which contains from 5% to 16% by weight of the thermally depolymerizable resin based on the weight of the glass-ceramic green sheet, and minute copper balls are filled in a row penetrating as through-holes through the glass-ceramic green sheet. If the amount of resin in the glass-ceramic green sheet is less than 5% by weight, based on the weight of the green sheet, the green sheet has a tendency to crack after being dried, as shown by line C in FIG. 1. If the amount is more than 16% by weight, the amount of carbonous residue increases as shown by line d in FIG. 1 and, consequently, the color of the fired structure is blackened.

Figure 2:
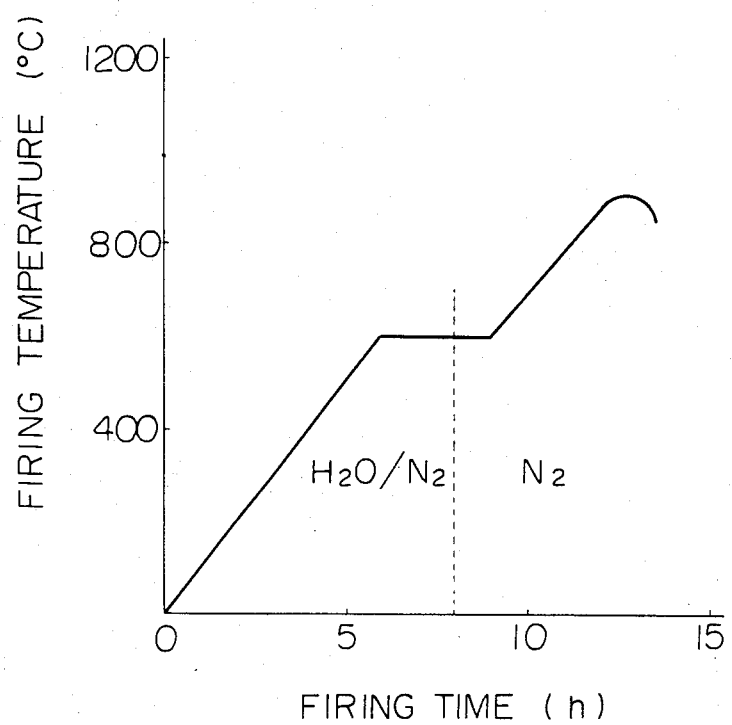
FIG. 2 is a graph of the relationship between time and temperature for firing a multilayered green structure.

The multilayered structure is fired in accordance with the graph shown in FIG. 2. The multilayered green structure is fired first at a relatively low temperature in an atmosphere of water-containing inert gas, preferably nitrogen, argon, or helium, during which the binder resin is depolymerized and eliminated, but the copper is not oxidized and the ceramic particles do not coalesce. Then, the water-containing inert gas is replaced by an inert gas atmosphere without water vapor and the temperature is raised to one where the ceramic particles coalesce, but the copper does not change in metallic state.

Figure 3:
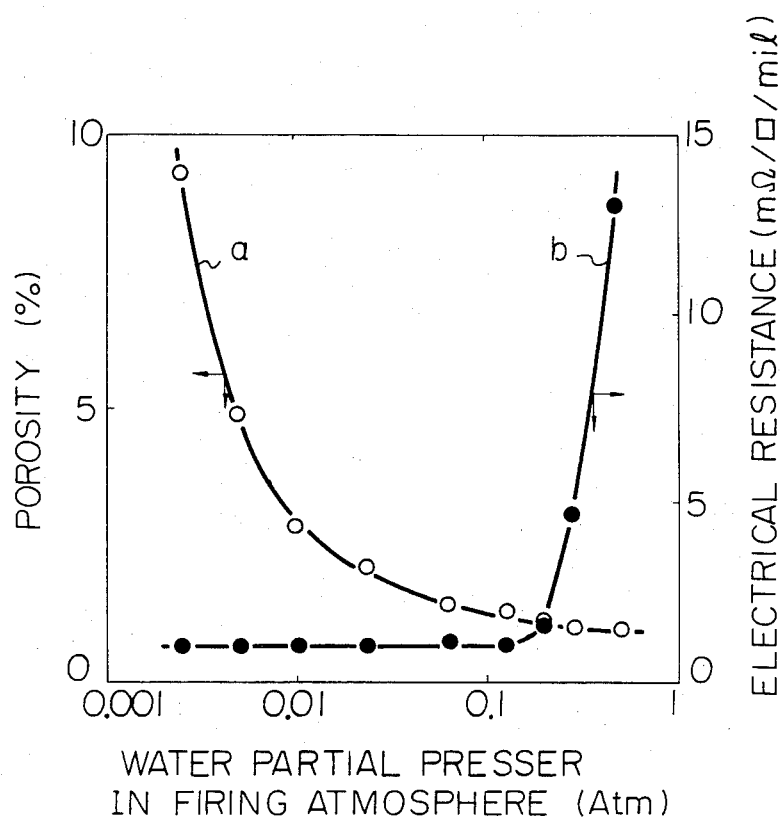
FIG. 3 is a graph of the porosity and electrical resistance of a sintered multilayered structure as a function of water partial pressure in an inert atmosphere.

The water-containing inert gas atmosphere of the first firing step contains water vapor with a partial pressure of from 0.005 to 0.3 atmosphere. If the pressure is lower than 0.005 atmosphere, the thermally depolymerizable resin contained in the glass-ceramic green sheet does not satisfactorily burn out and blackens in color, and the fired substrate increases in porosity, as shown by line a in FIG. 3. If the partial pressure of water is higher than 0.3 atmosphere, the copper particles begin to oxidize, and, thus, the resistance of the copper layer increases as shown by line b in FIG. 3.

The firing temperature in the first firing step is such that the binder contained in the glass-ceramic green sheet is depolymerized and eliminated, but its glass components and copper exhibit substantially no change in their state. The temperature is preferably from 550° C. to 650° C., at which even a low-melting point glass, such as a borosilicate glass, can be used because it does not coalesce thereat. If the temperature is lower than 550° C., the binder resin contained in the glass-ceramic green sheet does not satisfactorily burn out. If it is higher than 650° C., glass components of the green sheet begin to coalesce, although the burning rate is increased, thus, the removal of the binder is hindered. The molar ratio of $H_2/H_2O$ is calculated from the thermal decomposition equilibrium of water under a water partial pressure of 0.3 atmosphere without regard to the inert gas, to be about $10^{-8.3}$ at 550° C., and about $10^{-7.2}$ at 650° C.

The present invention will now be further illustrated by way of an example, which by no means limits the invention.

EXAMPLE

Thirty green sheets each 0.3 mm thick were prepared separately by a doctor-blade technique from a glass-ceramic paste. The composition of the glass-ceramic paste is shown in Table 1 and that of the glass-ceramic powder is shown in Table 2.

TABLE 1

| Composition of Glass-Ceramic paste | | |
|---|---|---|
| Components | | (Wt %) |
| Glass-ceramic powder | | 57.8 |
| Binder | Polymethyl methacrylate | 3.7 |
| Plasticizer | Dibutyl phthalate | 4.6 |
| Solvents | Methyl ethylketone | 16.1 |
| | Methyl alcohol | 8.7 |
| | Butyl alcohol | 2.9 |

TABLE 2

| Composition of Glass-Ceramic Powder | |
|---|---|
| Components | (Wt %) |
| $Al_2O_3$ | 50.5 |
| $SiO_2$ | 35.0 |
| $B_2O_3$ | 13.0 |
| $Na_2O$ | 0.75 |
| $K_2O$ | 0.70 |
| $Li_2O$ | 0.15 |
| CaO | 0.15 |

Patterns of copper conductor paste, sold under the trademark Du Pont 9923, were printed on each green sheet. Through-holes were formed by filling a row of minute copper balls through each sheet. Then, the green sheets were laminated so as to produce a multilayered green substrate.

This green substrate was fired in an atmosphere of nitrogen containing water, the partial pressure of which was 0.07 atm, at 650° C. for 3 hours, as shown in FIG. 2. Then, the atmosphere was replaced by nitrogen without water vapor and the temperature was raised up to 900° C., which was maintained for 1 hour.

The obtained multilayered glass-ceramic circuit substrate had an electrical resistance of the copper conductor layer of 1.2 mΩ/□/mil; a dielectric constant of the insulator layer of 5.6; and a bending strength of the substrate of 2000 kg/cm².

In the example, polymethyl methacrylate was used as the binder resin. Multilayered circuit substrates with similar electrical and mechanical performances can be obtained by using polytetrafluoroethylene or polymethylstyrene.

The present invention provides a method for producing a multilayered glass-ceramic circuit substrate having excellent characteristics, i.e., a high mechanical substrate strength due to dense and crackless ceramic; a low dielectric constant and a high insulation due to a lack of carbonous residue on the ceramic, and a low resistance copper conductor, due to firing the green laminate in an atmosphere with a wide range of gas ratio.

Furthermore, the present invention may be applied for producing a multilayered circuit substrate with molybdenum or tungsten as a conductor layer at a temperature lower than that of the prior art.

We claim:

1. A method for producing a multilayered glass-ceramic structure with copper-based conductors therein, comprising the steps of:
   (a) forming a multilayered structure having patterns of copper-based paste and ceramic layers laminated alternately, at least the ceramic layers located between the patterns of copper-based paste being glass-ceramic green sheets containing a thermally depolymerizable resin as a binder;
   (b) firing the multilayered structure in an inert atmosphere containing water vapor, the partial pressure of the water vapor being from 0.005 to 0.3 atmosphere, said firing at a temperature which is sufficient to depolymerize and eliminate the binder contained in the glass-ceramic green sheets, but which is not sufficient to cause a substantial change in the state of the glass components and copper; and
   (c) raising, in an inert atmosphere without water vapor, the firing temperature to a temperature at which particles of the glass components coalesce, but at which the metallic state of the copper is not affected.

2. A method according to claim 1, wherein said firing step (b) is carried out at a temperature of from 550° C. to 650° C.

3. A method according to claim 1, wherein said steps (b) and (c) comprise firing in an inert atmosphere selected from the group consisting of nitrogen, argon and helium.

4. A method according to claim 1, wherein the glass-ceramic green sheets used in said forming step (a) contain from 40% to 60% by weight of alumina based on the weight of glass-ceramic.

5. A method according to claim 1, wherein the thermally depolymerizable resin is selected from the group consisting of polymethyl methacrylate, polytetrafluoroethylene, poly-α-methylstyrene, and mixtures thereof.

6. A method according to claim 1, wherein said step (a) comprises printing patterns of copper-based conductors on each of the glass-ceramic green sheets to form composite layers, each of the glass-ceramic green sheets containing from 5% to 16% by weight of the thermally depolymerizable resin based on the weight of the glass-ceramic green sheet, laminating a plurality of the composite layers, and positioning a row of minute copper balls as through-holes in the multilayered structure.

7. A method according to claim 1, wherein said step (a) comprises alternately printing the patterns of copper-based paste and the glass-ceramic green sheets on a sintered ceramic substrate, the layer of glass-ceramic green sheets having openings to through-holes therethrough.

8. A method for producing a multilayered glass-ceramic structure having copper-based conductors therein, comprising the steps of:
   (a) forming a multilayered structure by alternately laminating glass-ceramic green sheets and patterns of copper-based paste, the glass-ceramic green sheets containing a thermally depolymerizable resin as a binder;
   (b) firing the multilayered structure at a first temperature in an inert atmosphere containing water vapor with a partial pressure of from 0.005 to 0.3 atmosphere, the first temperature being greater than or equal to the temperature at which the resin binder is depolymerized but less than or equal to the temperature at which a glass component of the glass-ceramic green sheets and the copper change state; and
   (c) firing the multilayered structure at a second temperature in an inert atmosphere which does not contain water vapor, the second temperature being greater than or equal to the temperature at which the glass components coalesce, but less than or equal to the temperature at which the copper changes from the metallic state.

9. A method according to claim 8, wherein the first temperature at which said firing step (b) is carried out is within the range of 550° C. to 650° C.

10. A method according to claim 9, wherein the glass-ceramic green sheets used in said forming step (a) contain from 40% to 60% by weight of alumina based on the weight of glass-ceramic.

11. A method according to claim 10, wherein said step (a) comprises:
    printing patterns of copper-based conductors on each of the glass-ceramic green sheets to form composite layers;
    laminating a plurality of the composite layers; and
    positioning a row of copper balls as through-holes in the laminated composite layer, wherein each of the glass-ceramic green sheets contains from 5% to 16% by weight of the thermally depolymerizable resin based on the weight of glass-ceramic.

12. A method according to claim 8, wherein the glass-ceramic green sheets used in said forming step (a) contain from 40% to 60% by weight of alumina based on the weight of glass-ceramic.

13. A method according to claim 8, wherein said step (a) comprises:
    printing patterns of copper-based conductors on each of the glass-ceramic green sheets to form composite layers;
    laminating a plurality of the composite layers; and
    positioning a row of copper balls as through-holes in the laminated composite layers, wherein each of the glass-ceramic green sheets contains from 5% to 16% by weight of the thermally depolymerizable resin based on the weight of glass-ceramic.

14. A method according to claim 8, wherein said firing step (b) is carried out at a temperature of from 550° C. to 650° C. for three hours, and wherein said firing step (c) is carried out at a temperature of approximately 900° C. for one hour.

* * * * *

UNITED STATES PATENT AND TRADEMARK OFFICE
CERTIFICATE OF CORRECTION

PATENT NO. : 4,504,339
DATED : March 12, 1985
INVENTOR(S) : KAMEHARA et al.

It is certified that error appears in the above-identified patent and that said Letters Patent is hereby corrected as shown below:

Front Page
(57) ABSTRACT

Line 7, delete "temperature".

Signed and Sealed this

Thirtieth Day of July 1985

[SEAL]

Attest:

DONALD J. QUIGG

Attesting Officer  Acting Commissioner of Patents and Trademarks